United States Patent
Nah et al.

(10) Patent No.: US 9,252,120 B2
(45) Date of Patent: Feb. 2, 2016

(54) COPPER POST SOLDER BUMPS ON SUBSTRATES

(71) Applicant: International Business Machines Corporation, Armonk, NY (US)

(72) Inventors: Jae-Woong Nah, Armonk, NY (US); Da-Yuan Shih, Armonk, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/012,785

(22) Filed: Aug. 28, 2013

(65) Prior Publication Data

US 2014/0370662 A1  Dec. 18, 2014

Related U.S. Application Data

(62) Division of application No. 13/078,807, filed on Apr. 1, 2011, now Pat. No. 8,669,137.

(51) Int. Cl.
*H01L 21/44* (2006.01)
*H01L 23/00* (2006.01)
(Continued)

(52) U.S. Cl.
CPC ............ *H01L 24/81* (2013.01); *H01L 21/4853* (2013.01); *H01L 21/563* (2013.01); *H01L 23/562* (2013.01); *H01L 24/11* (2013.01); *H01L 24/13* (2013.01); *H01L 24/16* (2013.01); *H01L 23/49816* (2013.01); *H01L 24/73* (2013.01); *H01L 24/83* (2013.01); *H01L 24/92* (2013.01); *H01L 2224/1132* (2013.01); *H01L 2224/1134* (2013.01); *H01L 2224/11312* (2013.01); *H01L 2224/11462* (2013.01); *H01L 2224/131* (2013.01); *H01L 2224/13022* (2013.01); *H01L 2224/13076* (2013.01); *H01L 2224/13147* (2013.01); *H01L 2224/1403* (2013.01); *H01L 2224/14051* (2013.01); *H01L 2224/14131* (2013.01); *H01L 2224/14135* (2013.01); *H01L 2224/1601* (2013.01); *H01L 2224/16225* (2013.01); *H01L 2224/16227* (2013.01); *H01L 2224/45124* (2013.01); *H01L 2224/73104* (2013.01); *H01L 2224/73204* (2013.01); *H01L 2224/81192* (2013.01); *H01L 2224/81193* (2013.01); *H01L 2224/81203* (2013.01); *H01L 2224/81815* (2013.01); *H01L 2224/83191* (2013.01); *H01L 2224/83192* (2013.01); *H01L 2224/83203* (2013.01); *H01L 2224/9211* (2013.01); *H01L 2924/00013* (2013.01);
(Continued)

(58) Field of Classification Search
USPC .......................................... 438/108, 118, 125
See application file for complete search history.

(56) References Cited

U.S. PATENT DOCUMENTS 7,476,564 B2 * 1/2009 Chen et al. ..................... 438/107
8,669,137 B2 * 3/2014 Nah et al. ...................... 438/108
(Continued)

*Primary Examiner* — Alexander Ghyka
(74) *Attorney, Agent, or Firm* — Robert J. Eichelburg; The Law Office of Robert J. Eichelburg

(57) ABSTRACT

A method of assembling a semiconductor flip chip comprising a wafer having solderable electrical conducting sites and a substrate having electrical connecting pads and electrically conductive posts operatively associated with the pads and extending away from the pads to terminate in distal ends, comprises the pre-assembly steps of solder bumping the distal ends through openings in a solder mask by injection molding solder onto the distal ends so that the distal ends extend into the mask through the openings to produce a solder bumped substrate, and soldering the solder bumped substrate to the sites.

3 Claims, 10 Drawing Sheets

(51) Int. Cl.
*H01L 21/56* (2006.01)
*H01L 21/48* (2006.01)
*H01L 23/498* (2006.01)

(52) U.S. Cl.
CPC . *H01L2924/00014* (2013.01); *H01L 2924/014* (2013.01); *H01L 2924/01013* (2013.01); *H01L 2924/01029* (2013.01); *H01L 2924/01079* (2013.01); *H01L 2924/10253* (2013.01); *H01L 2924/14* (2013.01); *H01L 2924/1461* (2013.01); *H01L 2924/15747* (2013.01); *H01L 2924/181* (2013.01)

(56) References Cited

U.S. PATENT DOCUMENTS

2007/0272389 A1* 11/2007 Gruber et al. ............ 164/488
2014/0170816 A1*  6/2014 Nah et al. ................. 438/126

* cited by examiner

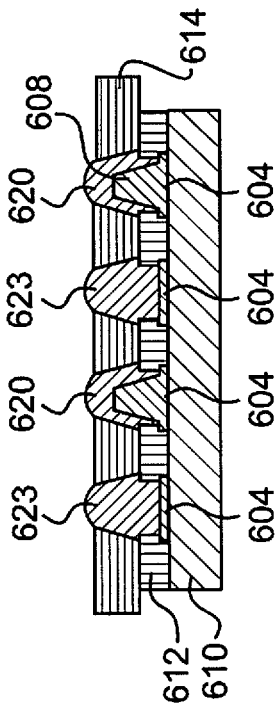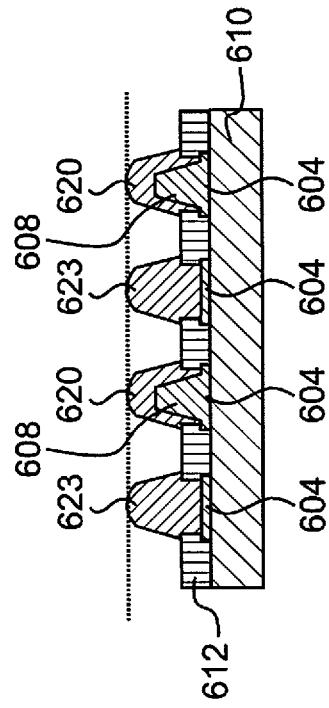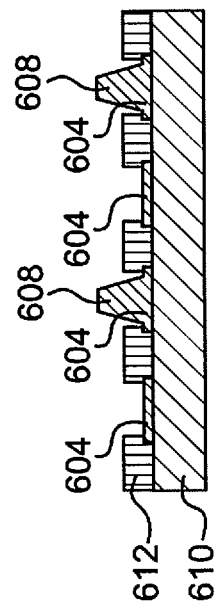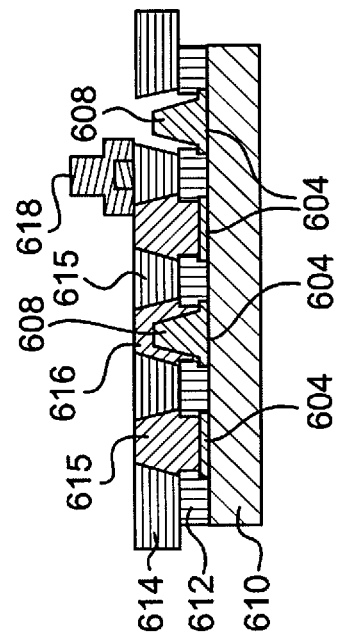

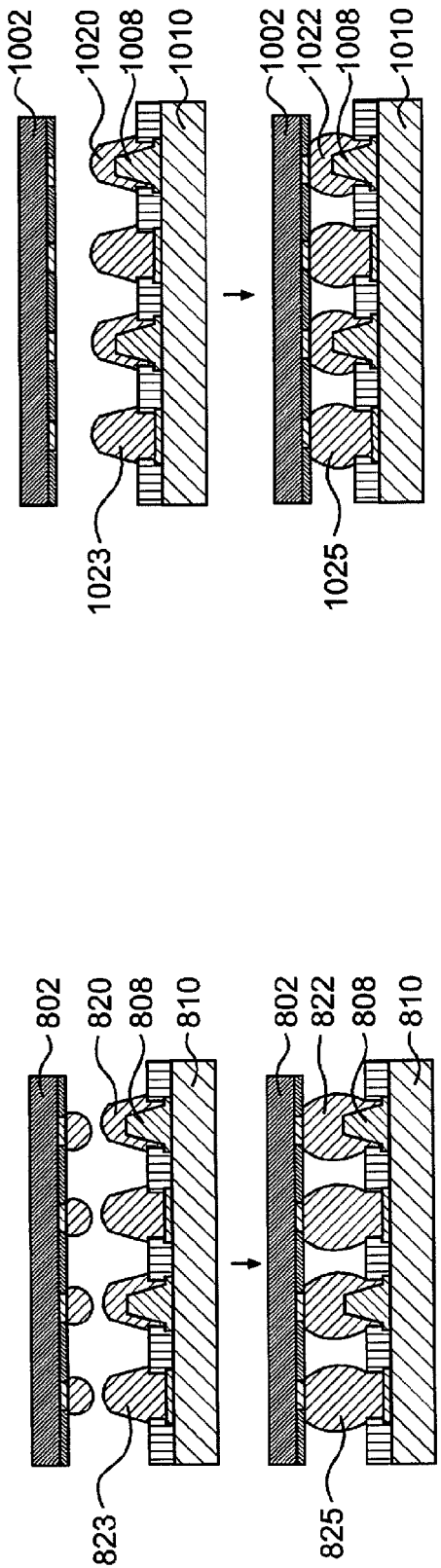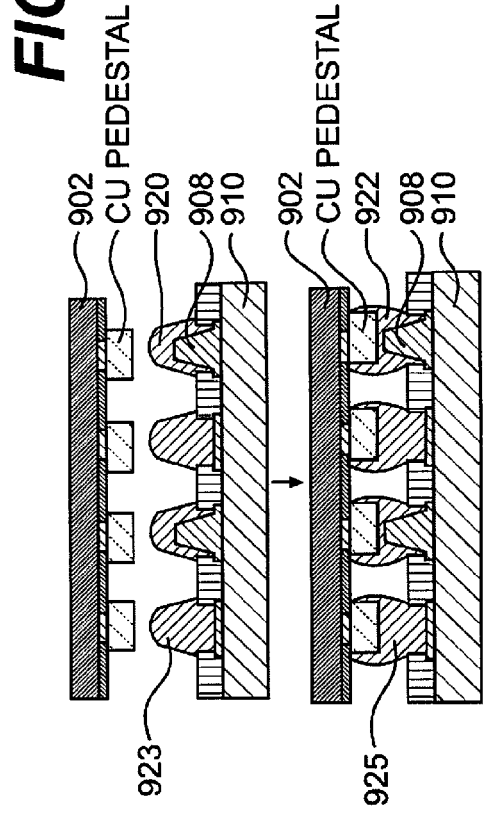
FIG. 10
FIG. 9
FIG. 8

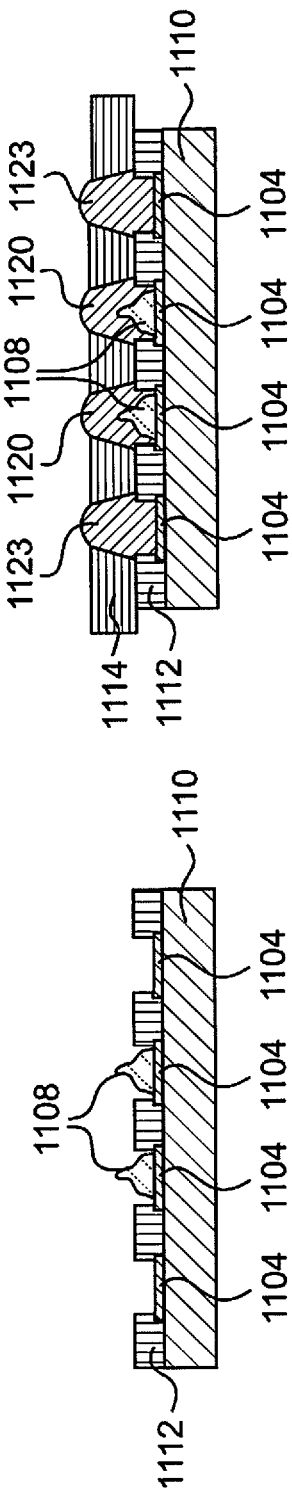
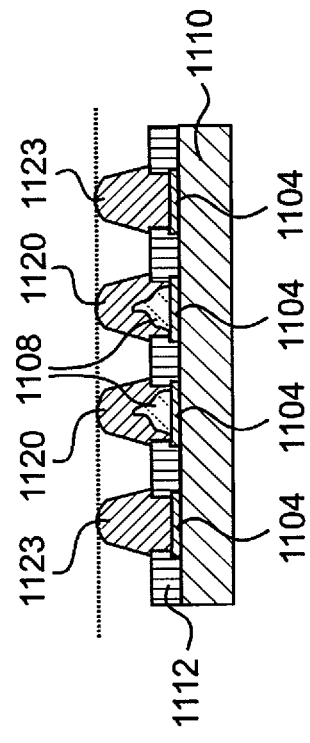
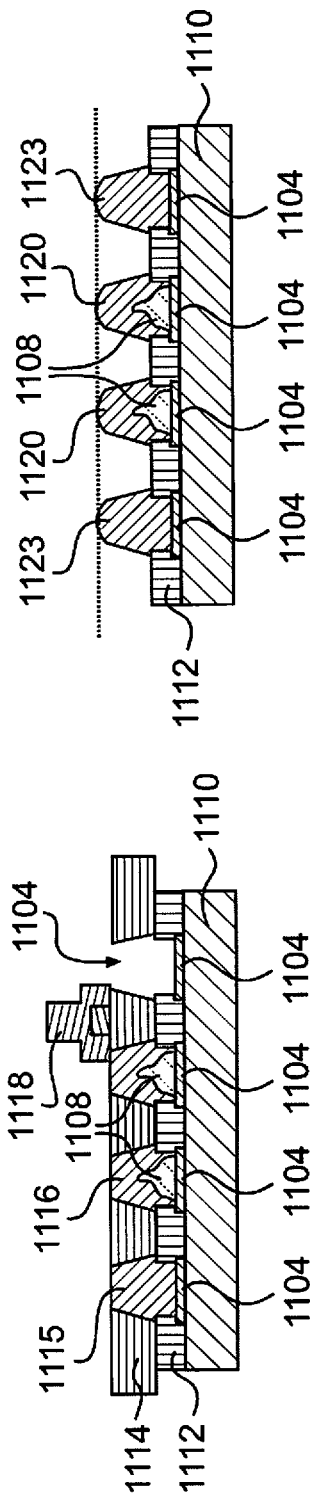

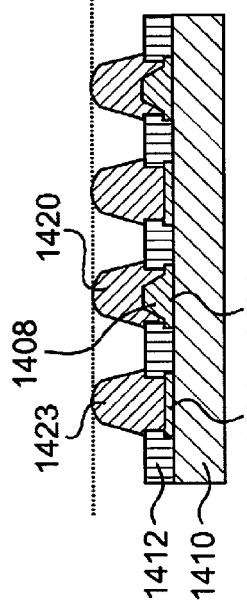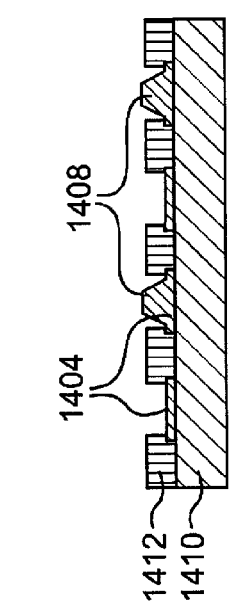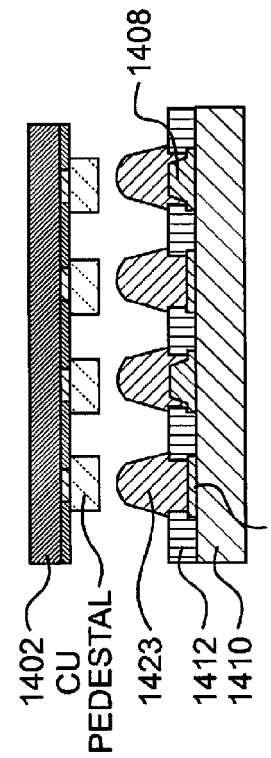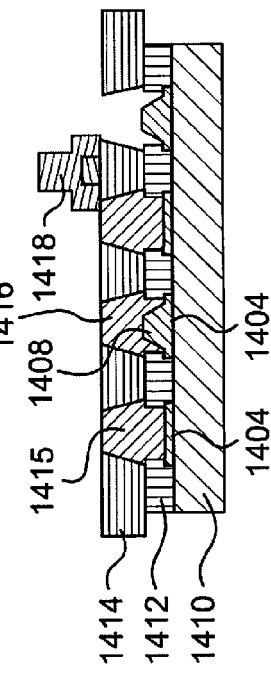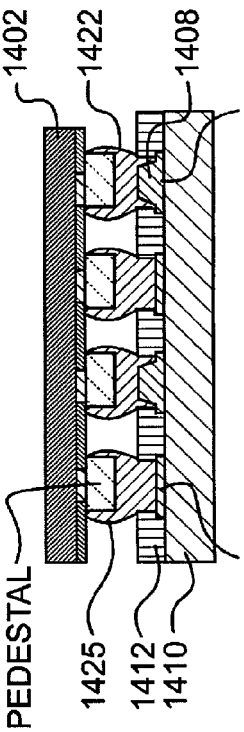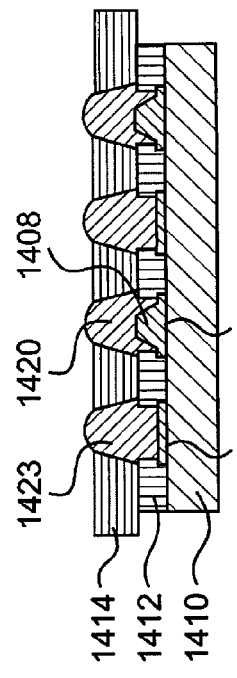

COPPER POST SOLDER BUMPS ON SUBSTRATES

DESCRIPTION OF THE INVENTION

1. Field of the Invention

The field of the invention comprises electrical interconnects between semiconductor devices and substrates on which such devices are packaged, and more particularly, injection molded solder techniques used to make these interconnects.

2. Background of the Invention

For solder flip chip assembly of a first level package or device, the solder interconnects are formed by joining solder bumps on the chip with solder bumps on the substrate. The solder bumps on the substrate help compensate for chip bump height variations and substrate warpage. Flip chip technology allows the largest numbers of inputs/outputs ("I/Os") for the smallest footprint of the chip. This enables manufacturing small packages known in the art as chip-scale packages.

IBM introduced this technology in the early 1960's with the solid logic technology in their IBM System/360™. It extended interconnection capabilities beyond existing wire-bonding techniques, allowing the area array solder-bump configuration to extend over the entire surface of the chip (die) providing solder bumps for interconnection to a substrate by the so-called "C4" method. This allowed for the highest possible I/O counts to meet the increasing demand for electrical functionality and reliability in IC technology. "C4" comprises the term for describing the method of connecting semiconductor and other devices, also known as the IBM "flip chip" or "controlled collapse chip connection," from which the industry derives the acronym "C4." The devices that employ C4 technology comprise integrated circuits ("IC" chips), passive filters, detector arrays and microelectromechanical systems ("MEMS") all of which are well known in the art. The present invention comprises processes for manufacturing these devices, and the products obtained by these processes.

The C4 method interconnects devices to external circuitry by means of solder bumps that have been deposited on semiconductor chip pads or substrates. In order to mount the chip to external circuits such as a circuit board or another chip or a wafer used in manufacturing other chips, a chip having solder bumps is flipped over so that the solder is aligned with matching connecting sites (e.g., connector pads) on an external circuit, and the connection completed by raising the temperature of the solder so that it flows and adheres to the connecting sites.

The original wafer-bumping process of metal mask evaporation comprised the evaporation onto a wafer surface of solder through mask openings in an area array fashion. This wafer-bumping and the structure obtained are sometimes referred to as ball limiting metallurgy or under board metallization, under mask metallization, or under mask-bump metallurgy ("UBM"). In its broader aspect UBM comprises the application of a metal coating to the die contact pads such as aluminum or copper contact pads, where the metal coating provides a surface that can adhere to solder. The UBM typically consist of an adhesion layer, such as Ti or TiW, a barrier layer, such as Ni and a solder wettable layer, such as Cu or Au to which the solder gets attached.

The need for increased I/O density and count, and pressures to lower the cost of flip-chip interconnections have spurred the development of other wafer bumping techniques such as electroplating or stencil-printing/paste-screening (solder paste) bump processes. Some of the more newly developed bumping processes include transfer printing, solder jetting, and bumpless and conductive particle applications.

Other techniques used for the solder bumping process on the semiconductor substrates include, for example, screen printing of solder paste, ball mounting of preformed solder balls, injection molded solder and the like.

The overview of flip chip technology shows its major advantage lies in utilizing the total chip area to make the I/O connections, whereas wire bonding uses only the chip periphery.

For solder flip chip assembly at tight bump pitch in the first level packaging, the flip chip interconnects are formed by the connection between solder bumps on the chip side and solder bumps on the substrate side. The solder bumps on the substrates help compensate for die bump height variations and substrate warpage. In order to get stringent substrate bump co-planarity, a coining process is applied to form flat tops on the solder bumps.

The current manufacturing technology for forming solder bumps on organic substrates is the solder paste stencil printing method. The stencil printing method is a low cost simple process for forming solder bumps on substrates which have island type I/Os without having to employ a photo lithography process.

As an alternative to the bumps on the substrates, Tessera reported etched Cu post substrate technology that can potentially reduce the interconnection thermal resistance. Hongyu Ran et al, "Thermal characterization of copper contact interconnect for DRAM package stacking in memory-intensive consumer applications", *Advancing Microelectronics*, Vol. 34, No. 6 (2007), pp. 10-14.

The Cu posts on the substrate enable a higher stand-off height between the chip and the substrate and better capability to carry higher current when the current flows from the substrate to the chip. The Cu posts on the substrate however do not include solder, so they need a sufficient volume of solder from the bumps on the chips to enable flip chip assembly. Even if the Cu-post substrates are used for flip chip packing with dies that have enough solder bumps, the increase of the Cu/solder ratio in the interconnects increases the stress transmitted to the Cu/ultra low k layers in the back-end-of-line ("BEOL") structure and results in flip chip assembly failure.

Also, for reliability benefits on electromigration to improve current carrying capability when the current flows from the chip to the substrate, Cu pillar die bumps only or Cu pillar die bumps with small solder caps have been integrated as chip side bumps in high volume manufacturing.

Claims have been made that the integrated Cu die side bumps using a Cu electroplating process in high volume manufacturing provide reliability benefits with regard to stress, electromigration and thermal conductivity. Andrew Yeoh et al., "Copper die bumps (First Level Interconnect) and Low-K dielectrics in 65 nm high volume manufacturing", Proceedings of 56th Electronic Components and Technology Conference, p. 1611, San Diego, Calif., May. 2006.

In the cases of Cu pillar die bumps only, or Cu pillar die bumps with small solder caps on the chip side, the Cu posts on the substrates cannot be used for flip chip packaging. The conventional flip chip assembly with Cu pillar die bumps only with Cu posts on the substrate is not possible because there is not any solder materials in the interconnect. Also, in the case of Cu pillar die bumps with small solder caps, the Cu/Sn ratio in a interconnect is too high.

Accordingly, it is generally desirable to have a new packaging paradigm for flip chips with high current capability in both directions of the solder joint, that is, from the chip to the substrate and from the substrate to the chip, along with less stress transmitted to the BEOL structure in order to increase the reliability of electronic products, i.e. the aforementioned devices.

RELATED ART

Gruber, et al. U.S. Pat. No. 7,713,575 and US Patent Application Publications US20090308308 and US20070272389 describe a compliant mold to deposit coplanar solder material interconnectors on a wafer. It receives solder depositions on a wafer's surface with either a one step coplanar deposition or subsequent coining of deposited solder to form a coplanar surface. The compliant mold has both a rigid side and a compliant side, which makes this method difficult to be applied to organic substrates that have significant warpage (bending). Warpage of organic substrates results in leakage of molten solder due to non-contact between the mold and the organic substrate. Also, with the cavities of the mold having a straight wall and the diameter of cavities being almost the same as the pad size, a large yield loss is expected due to breaking and/or sticking of solders inside the cavities of the mold.

Lin, US Patent Application Publication US20090079094 discloses a flip chip semiconductor package having a substrate with a plurality of active devices. A contact pad is formed on the substrate in electrical contact with the plurality of active devices. A passivation layer, second barrier layer, and adhesion layer are formed between the substrate and an intermediate conductive layer. The intermediate conductive layer is in electrical contact with the contact pad. A copper inner core pillar is formed by plating over the intermediate conductive layer. The inner core pillar has a rectangular, cylindrical, toroidal, or hollow cylinder form factor. A solder bump is formed around the inner core pillar by plating solder material and reflowing the solder material to form the solder bump. A first barrier layer and wetting layer are formed between the inner core pillar and solder bump. The solder bump is in electrical contact with the intermediate conductive layer.

Photolithography and electroplating cannot be used for solder bumping on the organic substrate without an additional seed layer in the electroplating step because the pads on the substrate are not electrically connected.

Chang, et al., US Patent Application Publication US20080296764 describes an enhanced wafer level chip scale packaging (WLCSP) copper electrode post having one or more pins that protrude from the top of the electrode post. When the solder ball is soldered onto the post, the pins are encapsulated within the solder material. The pins not only add shear strength to the soldered joint between the solder ball and the electrode post but also create a more reliable electrical connection due to the increased surface area between the electrode post/pin combination and the solder ball. Moreover, creating an irregularly shaped solder joint retards the propagation of cracks that may form in the intermetal compounds (IMC) layer formed at the solder joint. The step of bumping on the wafers (300) requires electroplating the copper and ball mounting the preformed solder balls.

Alvarez, US Patent Application Publication US20040130034 uses a layer of gold (405) disposed on upper surfaces (225) of copper pillars (210) on a bumped wafer (205) for forming a wafer level chip scale package. Coating material (410) is then applied to a level which is less than the height of the copper pillars (210), and etchant is disposed to remove coating material on the layer of gold (405) and to remove coating material (410) adhering to side surfaces of the copper pillars (210). Solder deposits are then disposed on the gold layer and reflowed to form balls (405) on the ends of the copper pillars (210), with the copper pillars (210) protruding into the solder balls (405). Bumping on the wafers (205) is thereby effected by electroplating the copper and ball mounting preformed solder balls.

Watanabe, U.S. Pat. No. 7,626,271 describes a method for producing a semiconductor device that employs a step in FIG. 4(B), of using a sealing portion 44 to cover exposed wiring patterns 42, base metal patterns 36, post electrodes 46, and interlayer insulation layer 34 followed by applying a sealing resin to fill in recess portions 42bb of the post electrode mounting portions 42b of wiring patterns 42. This exposes lower portions of the bottom surfaces 46b of the post electrodes 46. The sealing portion 44 may be formed using a well-known sealing material such as an epoxy type mold resin with a well-known method in the step of forming the sealing portion 44. After the sealing resin covers the top surfaces 46a of the post electrodes 46, the sealing resin is ground from a front side thereof with a well-known grinding method or a polishing method, so that the top surfaces 46a of the post electrodes 46 are exposed. In the next step, as shown in FIG. 4(B), solder balls 48a as the outer terminals 48 are formed on the top surfaces 46a of the post electrodes 46 exposed from a flat surface of the sealing portion 44. The process appears to use preformed solder balls for applying solder balls to the electroplated post electrode (46) of chip (30).

Fjelstad, U.S. Pat. No. 7,528,008 describes die pillar structures with (1), is replaced with a plurality of metallic portions 210 of a geometry similar to the photoresist portions (180/190/200) in FIGS. 3A-C. metallic portions 210 consisting of an etch resistant metal, such as nickel. A conductive layer around the metallic portions 210 may then be etched leaving the post capped with a conductive top. This conductive top may then be plated with a highly conductive layer, such as gold or a gold alloy. This conductive top further increases the reliability of an electrical connection when the posts are inserted into the type of socket shown in FIG. 4A. In an alternate embodiment, electro deposition solder can also be used as an etch resist. After the posts are created, the solder can then be reflowed to create a solder coated post. If the solder is reflowed after the post has been inserted into a test socket, it will create a more permanent electrical connection with the socket.

Lin, et al., U.S. Pat. No. 7,446,419 discloses a semiconductor chip having a welded stack of metal balls. For instance, a metal ball can be a stud bump that includes a ball bond and a stump and consist essentially of a ball bond, or alternatively, a ball bond without a stump. Furthermore, the metal balls can each be gold, aluminum, copper or solder, or alternatively, a solder coating and a coated metal, wherein the solder coating contacts the encapsulant and the coated metal, and the coated metal is spaced from the encapsulant.

Tan, et al., U.S. Pat. No. 7,462,942 describes the method of forming solder/Cu pillar bumps on wafers by electroplating. The electroplating cannot form bumps on the organic substrate without additional metal seed layer and photolithography because the pads on the organic substrate are not electrically connected. (Col 2:59) Pillar metal layer 26 is lead-free and is preferably comprised of copper (Cu). An optional layer of solder 28 is formed/plated over Cu pillar layer 26.

Chen, et al., U.S. Pat. No. 7,476,564 describes a copper pillar on a wafer; forming a solder on a substrate; and covering substantially all of the external surfaces of the pillar with the solder.

Lin, et al., U.S. Pat. No. 7,271,483 uses a bump structure on a semiconductor package for connecting a semiconductor element to a carrier of a semiconductor package. The semiconductor element has at least one electrical connection pad on its surface. The bump structure includes a UBM layer formed on an electrical connection pad and an I-shaped conductive pillar disposed on the UBM layer, wherein a middle portion of the conductive pillar has a width smaller than that of an upper end and a lower end of the conductive pillar respectively. The conductive pillar also has a solder material applied to it. Lin, et al. use photolithography to electroplate the solder onto the copper pillar using the metal seed layer as a conductor in the process.

Knapp, et al., U.S. Pat. No. 6,835,580 describes the ball mounting method of preformed solder balls to form solder bumps. This consists of forming a direct chip attach (DCA) device (1) includes attaching a chip (3) to a lead frame (2). Conductive studs (22) are attached to bonding pads (13) on the chip (3) and a flag (18) on lead frame (2). The chip (3) and flag (18) are enclosed with an encapsulating layer (4), and openings (6) are formed in an upper surface (7) to expose conductive studs (22). In one embodiment, a masking layer (51) is applied to the lead frame (2), and the structure is then placed in an electroless plating apparatus (61). While in the plating apparatus (61), an injection device (66) injects plating solution (71) towards the upper surface (7) and openings (6) to enhance the formation of barrier layers (24) on the conductive studs (22). Solder bumps (9) are then attached to barrier layers (24) through openings (6).

Hwee, et al., U.S. Pat. No. 6,510,976 describes the ball mounting method using preformed solder balls to form solder bumps on copper posts on the pads of the wafer. An oxidized (220) copper leadframe and a semiconductor die with copper posts extending from die pads, and with solder balls coated (225) with flux on the end of the copper posts, are provided. The semiconductor die is placed (230) on the oxidized copper leadframe, with the solder balls abutting portions of the layer of oxide, above and aligned with, interconnect locations on the leadframe. When reflowed (235), the flux on the abutting portions of the oxide layer selectively cleans these portions of the oxide layer, away from the interconnect locations. In addition, the solder balls change to molten state and adhere to the cleaned copper surfaces at the interconnect locations. Advantageously, the rest of the oxide layer that is not cleaned away provides a passivation layer that advantageously contains and prevents the molten solder from flowing away from the interconnect locations.

Lin, U.S. Pat. No. 6,103,552 describes electroless plating, screen or stencil printing methods to form solder bumps on copper posts on the redistribution layers of a wafer. This involves a WLP process including a post passivation RDL. The RDL is supported on a layer of polymeric material that is deposited on the passivation layer of the semiconductor structure. Another polymeric layer is deposited over the RDL, and etched or drilled to provide a via for over-filling with a metal to form an interconnect (i.e., a conducting post) that extends above and beyond the opening of the via. The top polymeric layer and the bottom polymeric layer are separated by a layer of chrome-copper, and therefore do not touch between the RDL structures. A solder bump attached to the protruding end of the post is formed by electroless plating, screen or stencil printing.

YOR920080772US1, which is commonly owned by the same assignee as the assignee of the present invention, discloses a method and apparatus for forming solder bumps on organic substrates, whereby molten solder is injected into a mask which is aligned on a substrate.

SUMMARY OF THE INVENTION

Accordingly, the present invention provides structures, articles of manufacture and processes that address these needs to not only provide advantages over the related art, but also to substantially obviate one or more of the foregoing and other limitations and disadvantages of the related art such as providing electromigration-resistant under-bump metallization. Not only do the written description, claims, abstract of the disclosure, and the drawings that follow set forth various features, objectives, and advantages of the invention and how they may be realized and obtained, but these features, objectives, and advantages will also become apparent by practicing the invention.

To achieve these and other advantages, and in accordance with the purpose of the invention as embodied and broadly described herein, the invention comprises a process, composition, and an improved structure. To achieve these and other advantages, and in accordance with the purpose of the invention as embodied and broadly described herein, the invention comprises an article of manufacture and a process comprising:

1. Forming solder caps or bumps on conductive pillars in a flip chip assembly, where the pillars comprise metallic posts such as Cu posts, by using injection molded solder (IMS) technology to solder bump or coat the distal ends of the posts, where the chip comprises a wafer and a substrate and the posts extend from the substrate.
2. bumping the distal ends through a mask and the distal ends extend from the substrate into the mask;
3. forming high volume IMS solder bumps on the distal ends of the Cu posts on the substrate to reduce the size and volume of the solder bumps on the wafer or eliminate the bumps on the wafer.
3. fabrication of selectively different bump structures by combining solder only and solder with a Cu post on one substrate to inter alia decrease the stress in Cu/ultra low k layers.
4. fabrication of small height Cu posts on the substrate combined with the injection molded solder method;
5. in a further aspect, forming a semiconductor flip chip from a wafer having solderable electrical conducting sites and a substrate having electrical connecting pads and electrically conductive posts operatively associated with the pads and extending away from the pads to terminate in distal ends, by the steps comprising solder bumping the distal ends through openings in a solder mask by injection molding solder onto the distal ends to produce a solder bumped substrate and soldering the solder bumped substrate to the sites where the distal ends extend into the mask;
6. employing the openings in the mask as reservoirs for receiving molten solder wherein the reservoir and the posts sealingly engage one another toward the proximal ends of the post in a manner to substantially minimize or eliminate the leakage of molten solder from the reservoir. In one embodiment we achieve this function by employing posts that taper from the proximal ends toward the distal ends in a narrowing fashion. This can also be achieved by employing reservoirs that taper from the point of solder injection toward the other end of the reservoir in a narrowing fashion, Also, both tapered posts and tapered reservoirs can be employed. An advantage in using tapered posts comprises easier insertion and/or alignment of the posts in the reservoir.

The "small height" Cu posts refers to Cu post heights shorter than the solder resist surface of the organic substrate.

Generally, the solder resist has a height of around 20 microns. In flip chip technology, greater than about 25 microns height over solder resist is required for good assembly yield. Therefore, small height Cu posts means from about 5 microns to about 20 microns which is shorter than the height of the solder resist. And, IMS adds solder on the Cu post to make the combined height of the Cu post and the solder added to the Cu post about 25 microns over the solder resist surface.

Small height Cu posts decrease the Cu/Sn ratio in an interconnect (joint) and decrease the stress in the BEOL, but, small height Cu posts makes low stand off height (the gap between a die and a substrate). "Small height Cu posts" is not to be confused with "stand off heights" which is the height of the Cu post plus the height of the solder bump. The disadvantages of low stand off heights are:

(1) it is difficult to clean flux residue;
(2) underfill flow is not easy, so voids are formed; and
(3) high stress from the CTE (Coefficient of thermal expansion) mismatch between the chip or wafer and the organic substrate.

The present invention, however, overcomes the difficulties of low stand off heights by placing injection molded solder on Cu posts to produce high bumps on substrates and helps to maintain high stand off heights after flip chip assembly which in turn provides the benefit of not only further decreasing the stress on the resultant structure, but also providing a structure where it is easy to clean the flux residue, underfill flow is easy thereby eliminating or minimizing void formation compared to prior processes, and minimizing or eliminating high stresses from the CTE mismatch between the chip or wafer and the organic substrate.

A core idea of this invention comprises using the combination of Cu post and molten solder injection with a mask to simultaneously form on one substrate, solder bumps having different compositions such as solder bumps comprising Sn, In, SnIn, SnCu, SnAg, SnAgCu, SnBi, SnPb, SnZn, SnSb, AuSn, SnAgCuZn, SnAgCuBi and alloys thereof and mixtures thereof and the like.

The injection of molten solder with a mask can form the solder bumps with uniform height on substrates independent of the shape any features inside the holes or reservoirs in the mask.

BRIEF DESCRIPTION OF THE DRAWINGS

The accompanying Figures, together with the detailed description herein serve to further illustrate various embodiments and to explain various principles and advantages of the present invention.

FIGS. 6A, 6B, 6C, 6D, comprising one embodiment of the invention, illustrates a side elevation in cross-section that depicts methods of forming uniform solder bump heights when Cu posts are selectively formed in one substrate. When the Cu posts are selectively formed, the total stress is reduced during the flip chip assembly process because the number of Cu posts in a substrate decreases. Injection molded solder bumping is a unique method for forming uniform solder bump heights when the Cu posts are selectively formed in one substrate.

FIG. 8 comprising one embodiment of the invention, illustrates a side elevation in cross-section that depicts methods of flip chip assembly between a chip with small solder bumps and a substrate with high volume solders on selectively formed Cu posts on a substrate by using the process flow which is explained in FIGS. 6A, 6B, 6C, 6D.

FIG. 9 comprising one embodiment of the invention, illustrates a side elevation in cross-section that depicts methods of assembly of a flip chip with small Cu pedestals for joining to a substrate by means of high volume solders on selectively formed Cu posts on the substrate by a process explained in FIGS. 6A, 6B, 6C, 6D.

FIG. 10 comprising one embodiment of the invention, illustrates a side elevation in cross-section that depicts methods of flip chip assembly between a chip without bumps and a substrate with the high volume solders on selectively formed Cu posts on a substrate by using the process flow which is explained in FIGS. 6A, 6B, 6C, 6D.

FIGS. 11A, 11B, 11C, 11D comprising one embodiment of the invention, illustrates a side elevation in cross-section of a low cost process wherein stud bumps from wire bonding can be used for forming selective metal bumps on a substrate. Stud bumps comprising Cu, Au, and Al or alloys thereof or any combination of Cu, Au, and Al or alloys thereof can be used in this method.

FIGS. 14A, 14B, 14C, 14D, 14E, 14F comprising one embodiment of the invention, illustrates a side elevation in cross-section of an alternative FIG. 13A, 13B, 13C, 13D, 13E, 13F of forming uniform solder bump heights when the small Cu posts are selectively formed in one substrate.

DETAILED DESCRIPTION OF THE INVENTION

To achieve these and other advantages, and in accordance with the purpose of this invention as embodied and broadly described herein, the following detailed embodiments comprise disclosed examples that can be embodied in various forms.

The specific processes, compounds, compositions, and structural details set out herein not only comprise a basis for the claims and a basis for teaching one skilled in the art to employ the present invention in any novel and useful way, but also provide a description of how to make and use this invention.

The present invention comprises methods of forming solder bumps on Cu posts positioned on the organic substrate of a semiconductor/organic substrate device by means of injection molding of molten solder through a reusable mask positioned on the device. We refer to semiconductors, wafers, dies and chips in our description of the invention and intend that these terms are to be considered as interchangeable, as are the terms copper posts and copper pillars.

An advantage of the invention comprises formation of solder bumps on Cu posts without an additional metal seed layer and without the need of employing a photolithographic process. The invention also comprises methods for forming uniform bump heights when the Cu posts are selectively formed in one substrate. When the Cu posts are selectively formed for power joints, the total stress on low k layers in the die is reduced during the flip chip assembly process because the number of Cu posts in the substrate decreases. The uniformity of bump heights in one substrate when the Cu posts are selectively applied is very important to obtain relatively high assembly yield.

The injection molded solder bumping method is a unique method for forming uniform bump heights when the Cu posts are selectively formed in one substrate.

For the most part, the related art describes methods for forming a structure of solder on the copper pillars that extend from the pads of the substrate by using an electroplating method for both solder and copper pillar. The electroplating method however, cannot form bumps on the organic substrate without applying an additional metal seed layer followed by photolithography because the pads on the organic substrate are not electrically connected.

Some related art describes the direct attachment of preformed solder balls on copper pillars, i.e., copper posts, positioned on the wafer pads. This method is very difficult to use with fine pitch copper pillars because of bridging issues with the solder bumps and throughput issues.

If the copper post on the substrate is higher than the solder mask, ball mounting with a mask also makes it very difficult to eliminate bridging of the solder balls because the solder balls could slip down from the top of the copper post even though a tacky flux is used.

Figure 1:
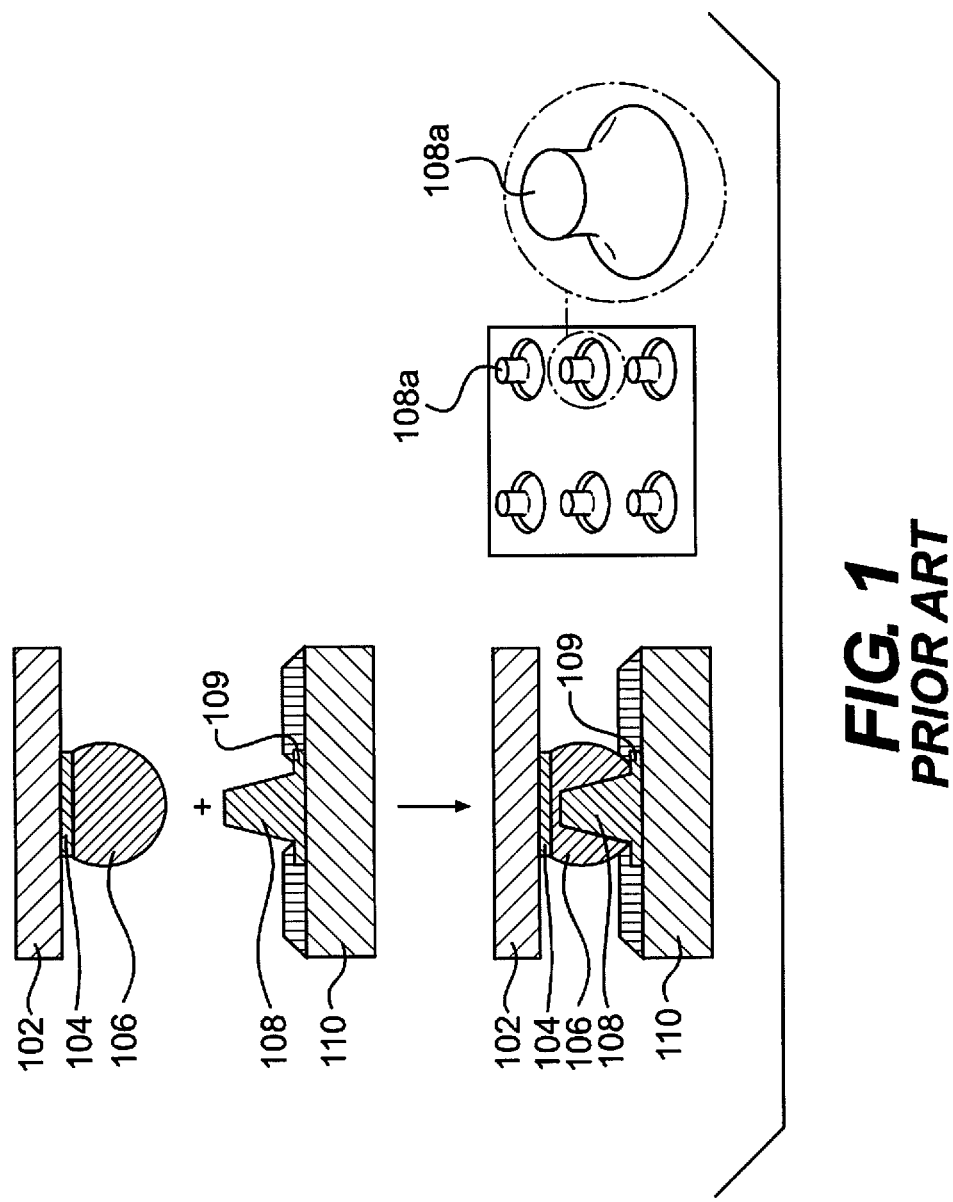
FIG. 1 is a side elevation in cross-section showing Tessera's Cu post substrates. All pads on a substrate have etched Cu posts and there is no solder on the substrate.
Figure 2A:
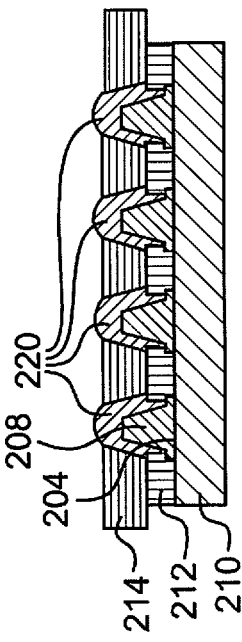
FIGS. 2A, 2B, 2C, 2D, comprising one embodiment of the invention, illustrate a side elevation in cross-section showing the formation of solder caps on Cu posts on a substrate by using the method described in YOR920080772US1.
Figure 2B:
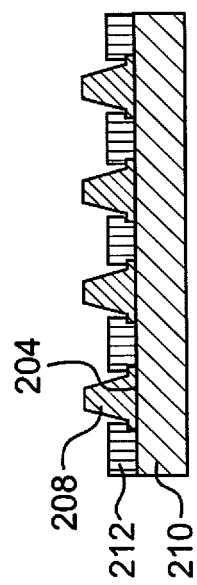
Figure 2C:
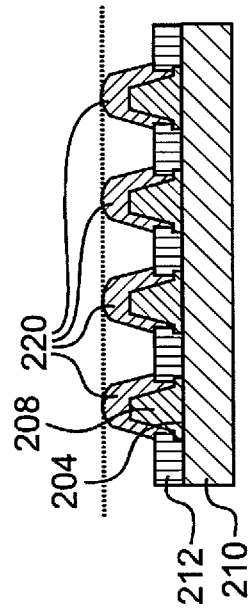
Figure 2D:

FIG. 1 illustrates the prior art device of Ran et al. (supra) consisting of a wafer or die 102 having a metal contact pad 104 with a solder ball 106 soldered to contact pad 104. Solder ball 106 in turn is soldered in a conventional way to a Cu post 108 that extends outwardly from an organic substrate 110. 108a comprises a three dimensional view of an etched Cu post 108 according to Ran et al. (supra). The "C4" pads referred to in FIG. 1 comprise pads 109 on the organic substrate and 104 on the chip or wafer, i.e., both 109 and 104 are called C4 pads.

FIGS. 2A, 2B, 2C, 2D illustrate one aspect of the invention comprising methods of solder bumping and structures obtained wherein Cu posts 208 are positioned on an organic substrate 210 and project outwardly from electrically conductive pads 204 through solder resist_212 sometimes referred to as a solder mask. The solder resist (212) prevents solder from bridging between conductors and creating short circuits.

Cu posts 208 extend through openings in mask 214 which allows placing molten solder caps 216 on Cu posts 208 by means of an IMS process by means 218, an IMS (Injection molded solder) head. Solder is melted inside IMS head 218 and the molten solder injected from head 218 into holes of mask. Upon cooling of the solder to form solidified solder caps 220, mask 214 is separated to provide solder bumped Cu posts having good co-planarity. Good co-planarity cannot be achieved with the prior art ball mounting process.

Figure 3:
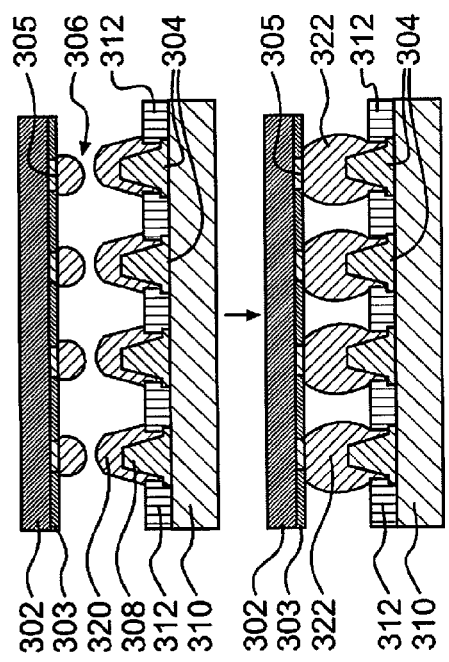
FIG. 3, comprising one embodiment of the invention, illustrates a side elevation in cross-section that depicts a method of flip chip assembly between a chip with small solder bumps and a substrate with the high volume solders on Cu posts which are formed on pads by using the process flow described by FIGS. 2A, 2B, 2C, 2D.

FIG. 3 illustrates one aspect of the invention comprising methods of wafer bumping and structures obtained wherein the size of the solder bumps on the wafer can be significantly reduced for attachment to the solder bumped Cu posts of the present invention. In FIG. 3, a solder bumped wafer or Si chip 302 includes electrical contact pads 305, solder bumped with solder balls 306 (sometimes referred to as bumping solder), positioned to face IMS solder bumped Cu posts 308 having solidified solder 320 extending toward solder balls 306. Layer 303 comprises a passivation layer made from SiO2, Si3N4, or polyimide to prevent solder bridging. Cu posts 308 project outwardly from electrically conductive pads 304 through solder resist 312 onto organic substrate 310. Joining wafer 302 to substrate 310 by soldering solder balls 306 to solder 320 results in the formation of solder connectors 322 with the size of the bumping solder substantially reduced compared to structures in which the chip or wafer is solder bumped in a conventional way. This reduces the thickness of the structure thereby allowing assembly of multiple devices in smaller packages.

Figure 4:
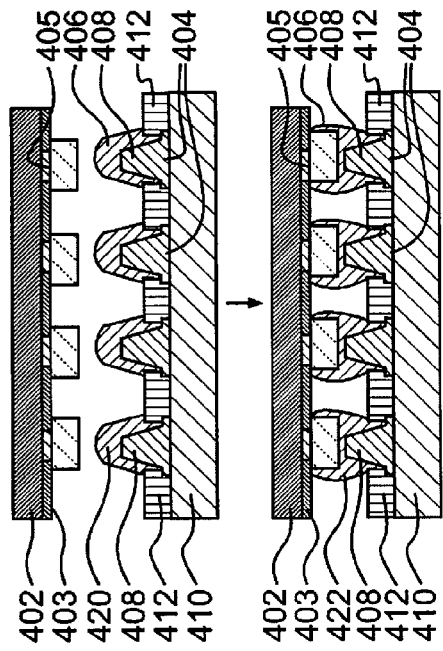
FIG. 4, comprising one embodiment of the invention, illustrates a side elevation in cross-section that illustrates the method of flip chip assembly between a chip with small Cu pedestals and a substrate by using high volume solders on Cu posts which are formed on pads by employing the process flow explained in FIGS. 2A, 2B, 2C, 2D.

FIG. 4 illustrates one aspect of the invention comprising methods of solder bumping and structures obtained wherein the solder bumps on the wafer are replaced with Cu pads 405 for attachment to the solder bumped Cu posts 408 of the present invention. In FIG. 4, a wafer or Si chip 402 includes electrical contact pads 405 connected to or operatively associated with Cu posts 408 where Cu posts 408 are positioned to face IMS solder bumped Cu posts 408 having solidified solder 420 extending toward Cu posts 408. Layer 403 comprises a passivation layer. Cu posts 408 project outwardly from electrically conductive pads 304 on organic substrate 410 through solder resist 412. Joining wafer 402 to substrate 410 by soldering Cu pedestals 406 to solder 420 results in the formation of solder connectors 422 to thereby reduce the thickness of the resultant structure compared to structures in which the wafer is solder bumped in a conventional way. This reduced thickness also allows assembly of multiple devices in smaller packages.

Figure 5:
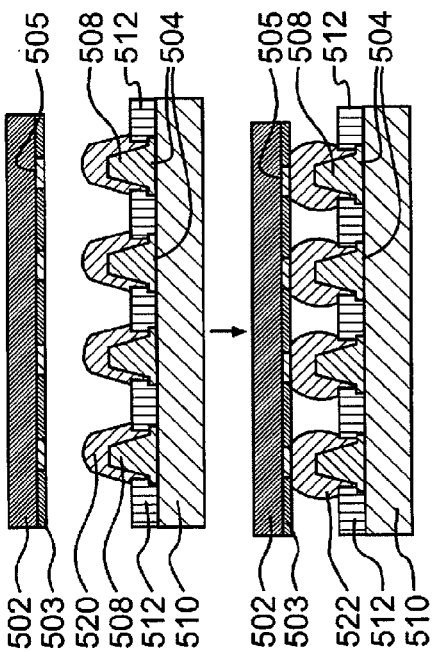
FIG. 5, comprising one embodiment of the invention, illustrates a side elevation in cross-section that depicts methods of flip chip assembly between a chip without bumps and a substrate with the high volume solders on Cu posts which are formed on the pads by using the process flow which is explained in FIGS. 2A, 2B, 2C, 2D.

FIG. 5 illustrates one aspect of the invention comprising methods of solder bumping and structures obtained wherein the solder bumps on the wafer are replaced with UBM pads 505 for attachment to the solder bumped Cu posts of the present invention. In FIG. 5, a wafer or Si chip 502 includes UBM pads 505 connected to or operatively associated with Cu posts 508 where Cu posts 506 are positioned to face IMS solder bumped Cu posts 508 having solidified solder 520 extending toward UBM pads 503 comprising a passivation layer. Cu posts 508 project through solder resist 512 from metal contact pads 504 positioned on organic substrate 510. Joining wafer 502 to substrate 510 by soldering UBM pads 505 to solder 520 results in the formation of solder connectors 522 to thereby reduce the thickness of the resultant structure compared to structures in which the wafer is solder bumped in a conventional way. This reduced thickness allows assembly of multiple devices in smaller packages.

FIGS. 6A, 6B, 6C, 6D illustrates one aspect of the invention comprising methods of solder bumping and structures obtained wherein selective Cu posts 608 are positioned on an organic substrate 610 and project outwardly from electrically conductive pads 604 through solder resist 612. Cu posts 608 extend through openings in mask 614 which allows placing molten solder by means of an IMS process comprising molten solder caps 616 on Cu posts 608 and molten solder 615 on electrical conducting pads 604 that do not have Cu posts on them. Means 618 comprises an IMS head.

In this embodiment, not all electrically conducting pads 604 have Cu posts 608 mounted on them; only alternate pads 604 include the Cu posts 608. In alternate embodiments, different patterns of pads 604 free of Cu posts 608 can be positioned on inorganic substrate 610 suited to the needs and design of the device ultimately assembled according to the process of the invention. Similarly, different patterns of pads 604 having Cu posts 608 can be positioned on inorganic substrate 610, again, suited to the needs and design of the device ultimately assembled according to the process of the invention. In any event, we selectively place Cu posts 608 on only some of the pads 604 in order to provide negative power interconnects to help reduce or eliminate electromigration. We have found that reducing the number of Cu posts on the substrate reduces the total stress on BEOL during the flip chip assembly process thereby reducing the failure rate in joining wafers to organic substrates.

Upon cooling the molten solder 615 and 616 to form solidified solder caps 620 and solidified solder columns 623, mask 614 is separated to provide solder bumped Cu posts and solder columns having good co-planarity. Good co-planarity cannot be achieved with the prior art ball mounting process.

Figure 7:
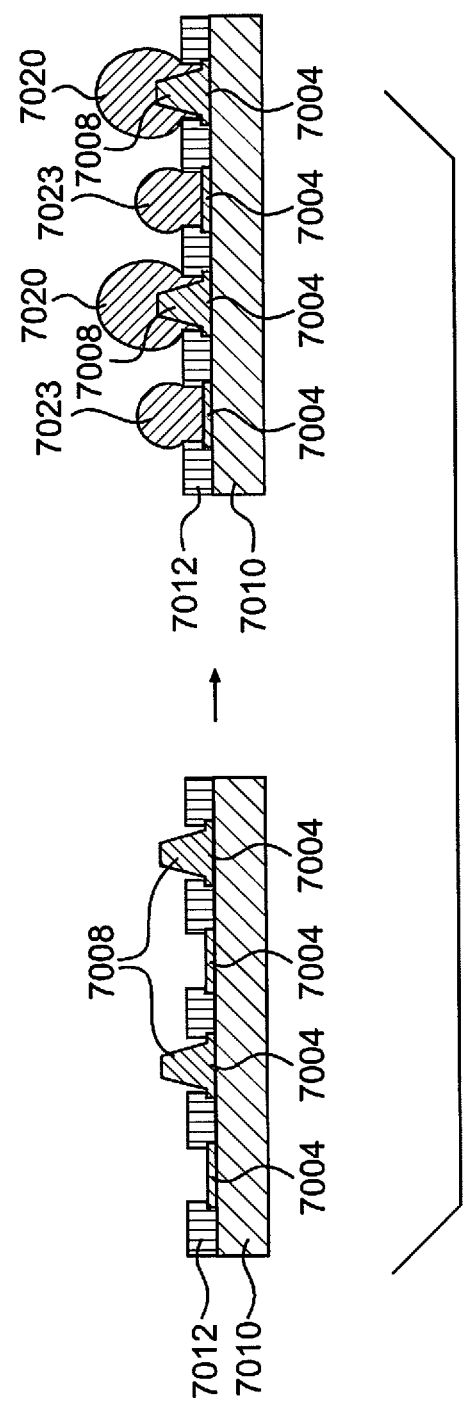
FIG. 7 comprising one embodiment of the invention, illustrates that other solder bumping methods such as micro-ball mounting cannot form uniform solder bump heights when Cu posts are selectively formed in one substrate.

FIG. 7 illustrates an advantage of the invention compared to the prior art solder bumping method. In FIG. 7, selective Cu posts 7088 are positioned on metal pads 7004 mounted on an organic substrate 7010 and project outwardly from electrically conductive pads 7004 through solder resist 7012. Cu posts 7008 extend outwardly from organic substrate 7010 which allows placing solder on them by means of a conventional ball mounting method as well as pads 7004 that do not have Cu posts on them.

The formed solder caps 7020 and solder bumps 7023 do not have good co-planarity as can be seen by comparing FIG. 7 to FIGS. 6A, 6B, 6C, 6D. This illustrates that the ball mounting method cannot produce uniform solder height on selectively formed Cu posts, which only the IMS method of the present invention can provide.

FIGS. 8-14 illustrate other embodiments of the invention. The structures and components of FIGS. 8-14 are identified therein or the structures or components have been illustrated, identified, and described with regard to FIGS. 2A, 2B, 2C, 2D-FIGS. 6A, 6B, 6C, 6D.

FIGS. 8, 9, and 10 illustrate aspects of the invention comprising methods of solder bumping and structures obtained and comprise a combination of the elements of FIGS. 3, 4, 5 and FIGS. 6A, 6B, 6C, 6D to obtain structures with Cu posts 808, 908, and 1008, capped with solder 820, 920 and 1020. FIGS. 8, 9, and 10 also illustrate solder columns 823, 923, and 1023, substantially co-planar with solder caps 820, 920, and 1020. These structures join wafers, e.g., silicon chips 802, 902, and 1002 to inorganic substrates 810, 910 and 1010 by soldering to form solder connector structures 822, 825, 922, 925, and 1022, 1025. This provides selective Cu posts on a substrate that improve electromigration reliability or higher stand-off in the resultant structures.

FIGS. 11A, 11B, 11C, 11D illustrate aspects of the invention comprising methods of solder bumping and structures obtained and comprise a combination of the elements of FIG. 10 but employs stud bumps 1108 made of Cu, Au or Al wire or any combination thereof or any alloy thereof in lieu of Cu posts. The stud bumps are formed by a wire bonding process known in the art and are used in this aspect of the invention to form selective metal bumps on an organic substrate as a low cost process.

Stud bumps 1108 are positioned on an organic substrate 1110 and project outwardly from electrically conductive pads 1104 through solder resist 1112. Stud bumps 1108 extend through openings in mask 1114 which allows placing molten solder by means of an IMS process comprising molten solder caps 1116 on Stud bumps 1108 and molten solder 1115 on pads 1104 that do not have Stud bumps on them. Means 1118 comprises an IMS head.

In this embodiment, not all electrically conducting pads 1104 have Stud bumps 1108 mounted on them; only alternate pads 1104 include the Stud bumps 1108. In other embodiments, different pads 1104 free of Stud bumps 1108 can be positioned on inorganic substrate 1110 suited to the needs and design of the device ultimately assembled according to the process of the invention. Similarly, different patterns of pads 1104 having Stud bumps 1108 can be positioned on inorganic substrate 1110, again, suited to the needs and design of the device ultimately assembled according to the process of the invention. In any event, we selectively place Stud bumps 1108 on only some of the pads 1104 in order to provide negative power interconnects to help reduce or eliminate electromigration. We have found that reducing the number of Stud bumps on the substrate reduces the total stress on BEOL during the flip chip assembly process thereby reducing the failure rate in joining wafers to organic substrates.

Upon cooling the molten solder 1115 and 1116 to form solidified solder caps 1120 and solidified solder columns 1123, mask 1114 is separated to provide solder bumped Stud bumps and solder columns having good co-planarity.

Figure 12A:
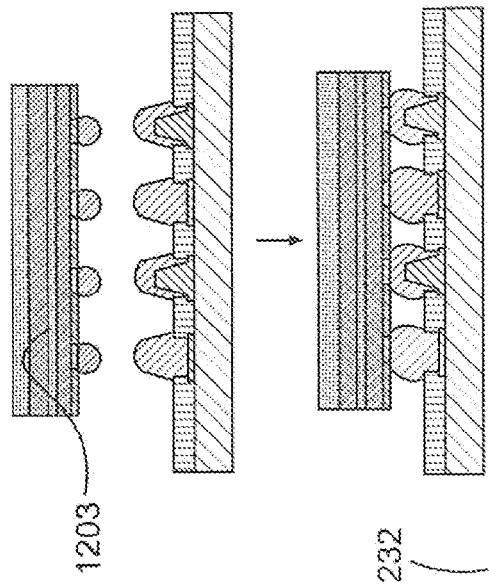
FIGS. 12A, 12B, 12C comprising one embodiment of the invention, illustrates a side elevation in cross-section of selective Cu posts with solder bumps on a substrate where the posts function as spacers for a flip chip with wafer level underfill (FIG. 12A), with no-flow underfill (FIGS. 12B), and 3D stacked chips (FIG. 12C) to avoid the collapse of joints. US Patent Application No. 2009/0108472 explains the wafer level underfill process. U.S. Pat. No. 7,087,485 B2 explains the no-flow underfill process.

FIG. 12A illustrates aspects of the invention comprising methods of solder bumping and structures obtained which are selective Cu posts with solder bumps on an organic substrate that work as spacers for a flip chip with wafer level underfill. FIG. 12A illustrates a combination of the elements of FIGS. 3, 4, 5 and 6. Selective Cu posts on a substrate 1210 employed in combination with solder bumps 1206 work as spacers for flip chips with wafer underfill 1230. US Published Patent Application 2009/0108472 explains wafer underfill processes and compositions. In this aspect, solder columns 1223, substantially co-planar with solder caps 1220, are employed with these solder caps 1220 for joining a wafer, e.g., silicon chip 1202 having solder balls 1206, to inorganic substrate 1210, through solder structures 1220-1223 to provide these selective Cu posts. The joining is effected by thermal compression bonding which causes underfill 1230 to flow and bond to both the wafer or silicon chip 1202 and the organic substrate 1210 as well as melting solder structures 1220 and 1223 and solder balls 1206 to form solder connectors 1222 and 1225.

Figure 12B:
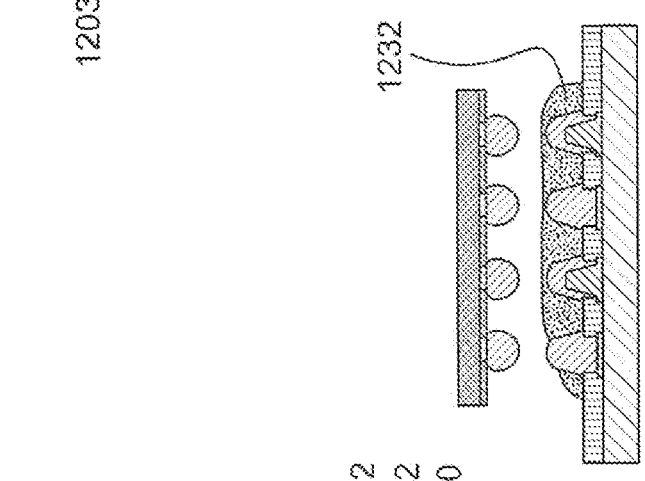

FIG. 12B illustrates aspects of the invention comprising methods of solder bumping and structures obtained which are selective Cu posts with solder bumps on an organic substrate that work as spacers for a flip chip and incorporates the method employed and the structure obtained in FIG. 12A except for the substitution of no-flow underfill 1232 for wafer underfill 1230. U.S. Pat. No. 7,087,485 explains no-flow unfill processes and compositions.

Figure 12C:
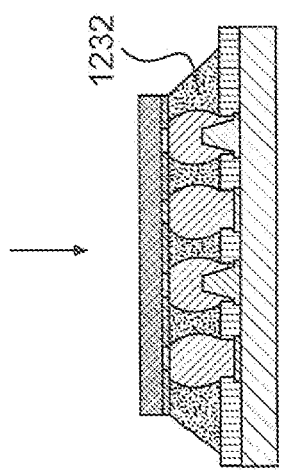
Figure 13A:
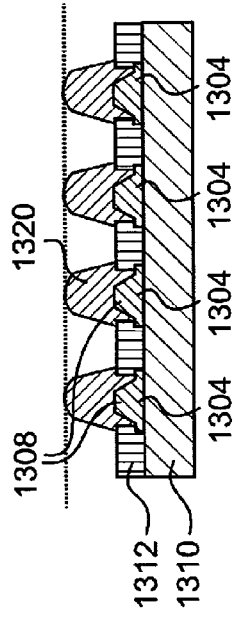
FIGS. 13A, 13B, 13C, 13D, 13E, 13F comprising one embodiment of the invention, illustrates a side elevation in cross-section of a small height Cu posts on the substrates to facilitate mask alignment for injection molded solder. The top of Cu post can be at the same level as the solder mask or lower than the solder mask. The small height of Cu posts can decrease the Cu/solder ratio in one joint and decrease the stress on the back end of the line during flip chip assembly processes.
Figure 13B:
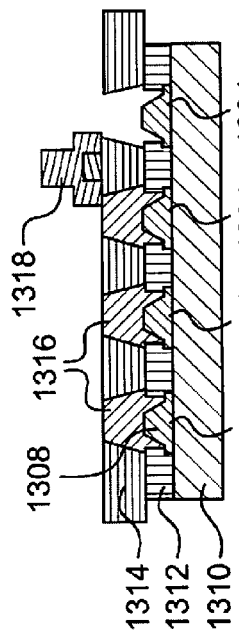
Figure 13C:
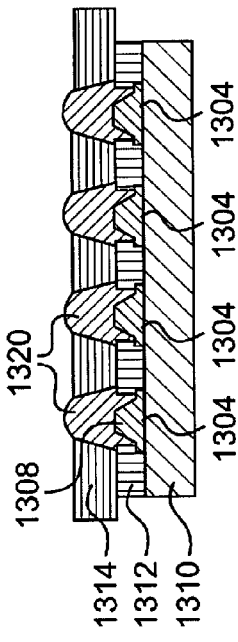
Figure 13D:
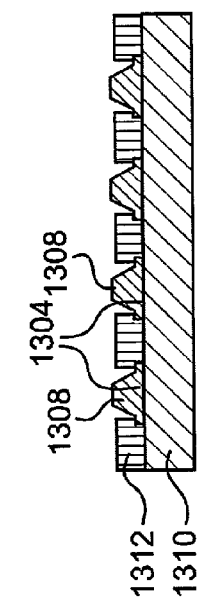
Figure 13E:
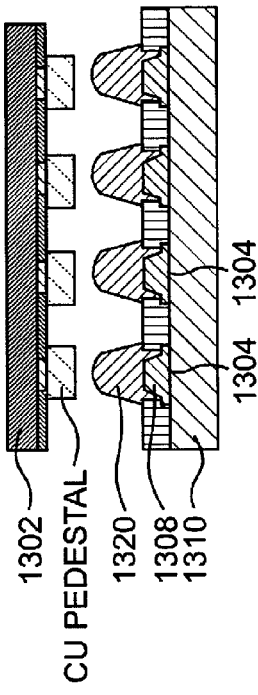
Figure 13F:
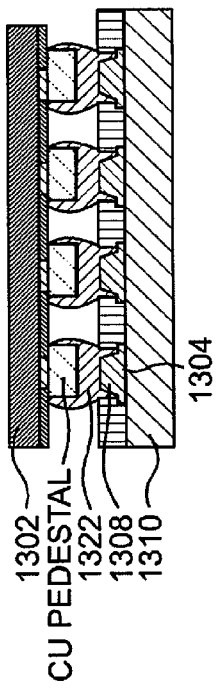

FIG. 12C illustrates aspects of the invention comprising methods of solder bumping and structures obtained which are selective Cu posts with solder bumps on an organic substrate that work as spacers for a flip chip and incorporates the method employed and the structure obtained in FIG. 12A except for the substitution of 3D stacked chips 1203 for Si chip 1202 and the elimination of wafer level underfill 1230.

In the foregoing embodiments, not all electrically conducting pads 1204 have Cu posts 1208 mounted on them; only alternate pads 1204 include the Cu posts 1208. In alternate embodiments, different pads 1204 free of Cu posts 1208 can be positioned on inorganic substrate 1210 suited to the needs and design of the device ultimately assembled according to the process of the invention. Similarly, different patterns of pads 1204 having Cu posts 1208 can be positioned on inorganic substrate 1210, again, suited to the needs and design of the device ultimately assembled according to the process of the invention. In any event, we selectively place Cu posts 1208 on only some of the pads 1204 in order to provide negative power interconnects to help reduce or eliminate electromigration. We have found that reducing the number of Cu posts on the substrate reduces the total stress on BEOL during the flip chip assembly process thereby reducing the failure rate in joining wafers to organic substrates.

FIGS. 13A, 13B, 13C, 13D, 13E, 13F illustrate one aspect of the invention comprising methods of solder bumping and structures obtained to address issues where mask alignment becomes problematic. In this aspect of the invention we adjust the height of the Cu posts to be about the same height as the mask through which it projects or somewhat less than the height of the mask.

FIGS. 13A, 13B, 13C, 13D, 13E, 13F illustrate a combination of the elements of FIGS. 4 and 6A, 6B, 6C, 6D to obtain a structure with Cu posts 1308 positioned on an organic substrate 1310 and project outwardly from electrically conductive pads 1304 through solder resist 1312. Cu posts 1308 extend up to or slightly below the openings in mask 1314 which allows placing molten solder by means of an IMS process comprising molten solder caps 1316 on Cu posts 1308 that extend from electrical conducting pads 1304. Means 1318 comprises an IMS head Upon cooling the molten solder 1315 to form solidified solder caps 1320, mask 1314 is separated to provide solder bumped Cu posts having good co-planarity. Good co-planarity cannot be achieved with the prior art ball mounting process.

Solder caps 1320 join wafers, e.g., silicon chips 1302, to inorganic substrate 1310, by soldering to form solder connector structures 1322. This provides Cu posts on a substrate that provides low stress during assembly because of the reduced Cu height. Furthermore, Cu on the substrate improves electromigration reliability or "negative flow," i.e., electrons flow from the substrate to the wafer or chip in a joint. Cu on the substrate also can improve interconnect thermal resistance. or higher stand-off in the resultant structures.

FIGS. 14A, 14B, 14C, 14D, 14E, 14F illustrates a combination of the elements of FIG. 4 and FIGS. 6A, 6B, 6C, 6D to obtain a structure with Cu posts 1408 positioned on an organic substrate 1410 and project outwardly from electrically conductive pads 604 through solder resist 1412. Cu posts 1408 extend up to or slightly below the openings in mask 1414 which allows placing molten solder by means of an IMS process comprising molten solder caps 1416 on Cu posts 1408 that extend from electrical conducting pads 1404 and molten solder 1415 on pads 1404 that do not have Cu posts on them. Means 1418 comprises an IMS head.

In this embodiment, not all electrically conducting pads 1404 have Cu posts 1408 mounted on them; only alternate pads 1404 include the Cu posts 1408. In alternate embodiments, different patterns of pads 1404 free of Cu posts 1408 can be positioned on inorganic substrate 1410 suited to the needs and design of the device ultimately assembled according to the process of the invention. Similarly, different patterns of pads 1404 having Cu posts 1408 can be positioned on inorganic substrate 1410, again, suited to the needs and design of the device ultimately assembled according to the process of the invention. In any event, we selectively place Cu posts 1408 on only some of the pads 1404 in order to provide negative power interconnects to help reduce or eliminate electromigration. We have found that reducing the number of Cu posts on the substrate reduces the total stress on BEOL during the flip chip assembly process thereby reducing the failure rate in joining wafers to organic substrates.

Upon cooling the molten solder 1415 and 1416 to form solidified solder caps 1420 and solidified solder columns 1423. Mask 1114 is separated to provide solder bumped Stud bumps and solder columns having good co-planarity. Good co-planarity cannot be achieved with the prior art ball mounting process.

Solder caps 1420 and solidified solder columns 1423 join wafers, e.g., silicon chips 1402, to inorganic substrate 1410, by soldering to form solder connector structures 1422 and 1425. This provides Cu posts on a substrate that provides low stress during assembly because of the reduced Cu height. Furthermore, Cu on the substrate side improves electromigration reliability or higher stand-off in the resultant structures as well as interconnect thermal resistance. The Cu post with solder is used in one embodiment as a power joint to provide electrical power to the structure obtained, and the solidified solder columns 1423 when soldered to the substrate and the wafer provide a signal joint between the substrate and the wafer.

In this embodiment, not all electrically conducting pads 1404 have Cu posts 1408 mounted on them; only alternate pads 1404 include the Cu posts 1408. In alternate embodiments, different patterns of pads 1404 free of Cu posts 1408 can be positioned on inorganic substrate 1410 suited to the needs and design of the device ultimately assembled according to the process of the invention. Similarly, different patterns of pads 1404 having Cu posts 1408 can be positioned on inorganic substrate 1410, again, suited to the needs and design of the device ultimately assembled according to the process of the invention. In any event, we selectively place Cu posts 1408 on only some of the pads 1404 in order to provide negative power interconnects to help reduce or eliminate electromigration. We have found that reducing the number of Cu posts on the substrate reduces the total stress on BEOL during the flip chip assembly process thereby reducing the failure rate in joining wafers to organic substrates.

In one embodiment we provide a method comprising forming a semiconductor flip chip from a wafer having solderable electrical conducting sites and a substrate having electrical connecting pads and electrically conductive posts operatively associated with the pads and extending away from the pads to terminate in distal ends, wherein the posts are placed only on some of the pads and solder bumps placed on at least some of the other of the pads that do not have the posts in order to decrease any stress in the flip chip, the steps comprising solder bumping the distal ends through openings in a solder mask by injection molding solder onto the distal ends to produce a solder bumped substrate and soldering the solder bumped substrate to the sites wherein the distal ends extend into the mask through the openings. In other embodiments the height of the posts may be substantially the same as the thickness of the mask or less than the thickness of the mask.

The foregoing method may further comprise positioning the solder bumped substrate on the wafer in a manner that leaves a gap between the wafer and the substrate and applying a no-flow underfill encapsulant layer between the wafer and the substrate to adhere to the wafer and the substrate.

Throughout this specification, abstract of the disclosure, and in the drawings the inventors have set out equivalents, including without limitation, equivalent elements, materials, compounds, compositions, conditions, processes, structures and the like, and even though set out individually, also include combinations of these equivalents such as the two component, three component, or four component combinations, or more as well as combinations of such equivalent elements, materials, compositions conditions, processes, structures and the like in any ratios or in any manner.

Additionally, the various numerical ranges describing the invention as set forth throughout the specification also includes any combination of the lower ends of the ranges with the higher ends of the ranges, and any single numerical value, or any single numerical value that will reduce the scope of the lower limits of the range or the scope of the higher limits of the range, and also includes ranges falling within any of these ranges.

The terms "about," "substantial," or "substantially" as applied to any claim or any parameters herein, such as a numerical value, including values used to describe numerical ranges, means slight variations in the parameter. In another embodiment, the terms "about," "substantial," or "substantially," when employed to define numerical parameter include, e.g., a variation up to five per-cent, ten per-cent, or 15 per-cent, or somewhat higher.

All scientific journal articles and other articles, including internet sites, as well as issued and pending patents that this written description mentions including the references cited in such scientific journal articles and other articles, including internet sites, and such patents, are incorporated herein by reference in their entirety and for the purpose cited in this written description and for all other disclosures contained in such scientific journal articles and other articles, including internet sites as well as patents and the aforesaid references cited therein, as all or any one may bear on or apply in whole or in part, not only to the foregoing written description, but also the following claims, abstract of the disclosure, and appended drawings.

Although the inventors have described their invention by reference to some embodiments, other embodiments defined by the doctrine of equivalents are intended to be included as falling within the broad scope and spirit of the foregoing written description, and the following claims, abstract of the disclosure, and appended drawings.

We claim:

1. In a method comprising forming a semiconductor flip chip from a wafer having solderable electrical conducting sites and a substrate having electrical connecting pads and electrically conductive posts operatively associated with said pads and extending away from said pads to terminate in distal ends, wherein said posts are placed only on some of said pads and solder bumps placed on at least some of the other of said pads that do not have said posts in order to decrease any stress in said flip chip, the steps comprising solder bumping said distal ends through openings in a solder mask by injection molding solder onto said distal ends to produce a solder bumped substrate and soldering said solder bumped substrate to said sites wherein said distal ends extend into said mask through said openings.

2. The method of claim 1 where the height of said posts is substantially the same as the thickness of said mask or less than the thickness of said mask.

3. The method of claim 1 further comprising positioning said solder bumped substrate on said wafer in a manner that leaves a gap between said wafer and said substrate and applying a no-flow underfill encapsulant layer between said wafer and said substrate to adhere to said wafer and said substrate.

* * * * *